(12) United States Patent
Sankin et al.

(10) Patent No.: US 8,269,262 B2
(45) Date of Patent: Sep. 18, 2012

(54) VERTICAL JUNCTION FIELD EFFECT TRANSISTOR WITH MESA TERMINATION AND METHOD OF MAKING THE SAME

(75) Inventors: Igor Sankin, Starkville, MS (US); Joseph Neil Merrett, Starkville, MS (US)

(73) Assignee: SS SC IP LLC, Jackson, MS (US)

( * ) Notice: Subject to any disclaimer, the term of this patent is extended or adjusted under 35 U.S.C. 154(b) by 0 days.

(21) Appl. No.: 11/836,994

(22) Filed: Aug. 10, 2007

(65) Prior Publication Data

US 2008/0093637 A1 Apr. 24, 2008

Related U.S. Application Data

(63) Continuation-in-part of application No. 11/415,279, filed on May 2, 2006, now Pat. No. 7,274,083.

(51) Int. Cl.
*H01L 29/66* (2006.01)

(52) U.S. Cl. .................. 257/262; 257/E29.178

(58) Field of Classification Search ............. 257/135, 257/136, 262, 267, 280, 472, E27.068, E27.148, 257/E29.178, E29.271, E29.317, E29.318
See application file for complete search history.

(56) References Cited

U.S. PATENT DOCUMENTS

| | | | |
|---|---|---|---|
| 4,982,260 A | 1/1991 | Chang et al. | |
| 5,449,925 A | 9/1995 | Baliga et al. | |
| 6,104,043 A | 8/2000 | Hermansson | |
| 6,175,143 B1 | 1/2001 | Fujihira et al. | |
| 6,524,900 B2 | 2/2003 | Dahlqvist | |
| 6,573,128 B1 | 6/2003 | Singh | |
| 6,861,723 B2 | 3/2005 | Willmeroth | |
| 6,897,133 B2 | 5/2005 | Collard | |
| 7,479,672 B2 | 1/2009 | Zhao | |
| 2001/0054715 A1 | 12/2001 | Collard et al. | |
| 2003/0045035 A1 | 3/2003 | Shenai et al. | |
| 2004/0159865 A1* | 8/2004 | Allen et al. | 257/280 |
| 2005/0067630 A1* | 3/2005 | Zhao | 257/134 |
| 2006/0011924 A1 | 1/2006 | Mazzola et al. | |

(Continued)

OTHER PUBLICATIONS

D.T. Morisette and J.A. Cooper, Jr: "Theoretical Comparison of SiC PiN and Schottky Diodes Based on Power Dissipation Considerations," IEEE Transactions on Electron Devices, vol. 49, No. 9, Sep. 2002, pp. 1657-1664.

(Continued)

*Primary Examiner* — Ha Tran T Nguyen
*Assistant Examiner* — Vongsavanh Sengdara
(74) *Attorney, Agent, or Firm* — Morris, Manning & Martin, LLP; Christopher W. Raimund

(57) ABSTRACT

A vertical junction field effect transistor (VJFET) having a mesa termination and a method of making the device are described. The device includes: an n-type mesa on an n-type substrate; a plurality of raised n-type regions on the mesa comprising an upper n-type layer on a lower n-type layer; p-type regions between and adjacent the raised n-type regions and along a lower sidewall portion of the raised regions; dielectric material on the sidewalls of the raised regions, on the p-type regions and on the sidewalls of the mesa; and electrical contacts to the substrate (drain), p-type regions (gate) and the upper n-type layer (source). The device can be made in a wide-bandgap semiconductor material such as SiC. The method includes selectively etching through an n-type layer using a mask to form the raised regions and implanting p-type dopants into exposed surfaces of an underlying n-type layer using the mask.

20 Claims, 13 Drawing Sheets

U.S. PATENT DOCUMENTS

| | | | | |
|---|---|---|---|---|
| 2006/0113593 | A1* | 6/2006 | Sankin et al. | 257/341 |
| 2006/0273421 | A1* | 12/2006 | Yasuoka et al. | 257/438 |
| 2007/0096145 | A1 | 5/2007 | Watanabe | |
| 2007/0296028 | A1* | 12/2007 | Brar et al. | 257/328 |
| 2008/0318387 | A1* | 12/2008 | Jain et al. | 438/305 |

OTHER PUBLICATIONS

I. Sankin, J.B. Casady, "Power SiC MOSFETs," book chapter: Advances in Silicon Carbide Processing and Applications, S. E. Saddow and A. Agrawal, Editors.

H. Saitoh, T. Kimoto, and H. Matsunami: "Origin of Leakage current in SiC Schottky Barrier Diodes at High Temperature," Material Science Forum vols. 457-460 (2004) pp. 997-1000.

A.O. Konstantinov, Q. Wahab, N. Nordell, U. Lindefelt: "Ionization rates and critical fields in 4H silicon carbide," Appl. Phys. Lett., vol. 71, No. 1, Jul. 7, 1997, pp. 90-92.

Zhao, et al., "Current Status and Future Prospects of SiC Power JFETs and ICs," Invited Paper of IEICE Transaction on Electronics, 2007.

Zhao, et al., "1710-V 2.77-m$\Omega$cm2 4H-SiC Trenched and Implanted Vertical Junction Field-Effect Transistors," IEEE Electron Device Letters, vol. 24, No. 2, Feb. 2003.

Zhao, et al., "6A 1kV 4H-SiC Normally-off Trenched-and-Implanted Vertical JFETs," Materials Science Forum, vols. 457-460, pp. 1213-1216, 2004.

Zhao, et al., "3.6m$\Omega$cm2, 1726 V 4H-SiC Normally-off Trenched-and-Implanted Vertical JFETs and Circuit Applications," IEE Proc-Circuits Devices Syst., vol. 151, No. 3, Jun. 2004.

Zhao, et al., "Fabrication and Characterization of 11-kV Normally Off 4H-SiC Trenched-and-Implanted Vertical Junction FET," IEEE Electron Device Letters, vol. 25, No. 7, Jul. 2004.

Zhao, "Silicon Carbide Power Field-Effect Transistors,"MRS Bulletin, vol. 30, Apr. 2005.

Zhao, et al., "Design, Fabrication and Application of 4H-Sic Trenched-and-Implanted Vertical JFETs," Materials Science Forum, vols. 527-529, pp. 1191-1194, 2006.

Li, et al., "10kV, 87$\Omega$cm2 Normally-off 4H-SiC Vertical Junction Field-Effect Transistors," Materials Science Forum, vols. 527-529, pp. 1187-1190, 2006.

B.J. Baliga, "Analysis of a high-voltage merged p-i-n/Schottky (MPS) rectifier," IEEE Electron Device Letters, vol. 8, Issue 9, Sep. 1987 pp. 407-409.

W.V. Muench and I. Plaffeneder: "Breakdown field in vapor-grown silicon carbide p-n junctions," Journal of Applied Physics, vol. 48, No. 11, Nov. 1977.

V.E. Chelnokov, A.M. Strel'chuk, P.A. Ivanov; G. Lentz, C. Pamiere: "Silicon carbide p-n structures as power rectifiers," Proceedings of the 6th International Symposium on Power Semiconductor Devices and ICs, 1994. ISPSD '94, pp. 253-256.

K.V. Vasilevskki, K. Zekentes, A.V. Zorenko, and L.P. Romanov: "Experimental Determination of Electron Drift Velocity in 4H-SiC p+-n-n+ Avalanche Diodes," IEEE Elector Device Letters, vol. 21, No. 10, Oct. 2000 pp. 485-487.

L. Yuan, J.A. Cooper, Jr., M.R. Melloch, and K.J. Webb: "Experimental Demonstration of a Silicon Carbide IMPATT Oscillator," IEEE Electron Device Letters, vol. 22, No. 6, Jun. 2001, pp. 266-268.

\* cited by examiner

HIGHEST $E_{1D\ MAX}$ = 2.53 MV/cm;
MEAN $E_{1D\ MAX}$ = 2.40 MV/cm;
$E_{1D\ MAX}$ STANDARD DEVIATION: $\sigma$ = 0.035 MV/cm;
$E_{1D\ MAX}$ UNIFORMITY: $\frac{\sigma}{MEAN}$ = 1.45%

VERTICAL JUNCTION FIELD EFFECT TRANSISTOR WITH MESA TERMINATION AND METHOD OF MAKING THE SAME

This application is a continuation-in-part of U.S. patent application Ser. No. 11/415,279, filed on May 2, 2006, now allowed, which is incorporated by reference herein in its entirety.

STATEMENT REGARDING FEDERALLY SPONSORED RESEARCH

This invention was made with U.S. Government support under Air Force Research Laboratory Agreement No. F33615-02-D-2103. The U.S. Government may have certain rights in this invention.

BACKGROUND

1. Technical Field

The application relates generally to semiconductor devices and methods of making the same, in particular, to vertical junction field effect transistors (JFETs) having a mesa edge termination.

2. Background of the Technology

Monolithic devices comprising Schottky and PiN diodes are known (See, for example, U.S. Pat. No. 6,861,723 and [1]). U.S. Pat. No. 6,573,128 discloses a SiC Junction Barrier Schottky (JBS)/Merged P-I-N Schottky (MPS) grid that is formed of Schottky metal deposited on p-type islands defined by plasma etching through an epitaxially grown layer. However, this structure is unable to effectively protect itself from a surge current because of the absence of p-type ohmic contacts on the p-type regions and insufficient conductivity modulation caused by low doping of p-type regions.

U.S. Pat. Nos. 6,104,043 and 6,524,900 disclose JBS/MPS diodes having heavily doped p-type regions formed by ion implantation. If ohmic contacts to heavily doped implanted p-type regions are formed as disclosed in U.S. Pat. No. 6,104,043, however, the conductivity modulation in the drift region of such a structure suffers from low minority carrier lifetime caused by residual implantation damage even after thermal anneal at high temperature.

U.S. Pat. No. 4,982,260 describes the definition of p-type emitter regions by etching through the heavily doped p-type well created by diffusion. However, since diffusion of dopants into SiC occurs very slowly at even extremely high temperatures, as a practical matter, a p-type well can only be formed in n-type SiC by ion implantation, which has the disadvantage described above.

U.S. Pat. No. 6,897,133 describes forming p-type emitter regions by etching trenches in n-type material and filling them with p-type epitaxially grown material followed by chemical-mechanical polishing or another planarization step. This device, however, has JFET regions that may significantly limit current conduction under normal operating conditions.

SiC devices that employ mesa edge termination are also known [2]. Mesa edge termination technology for Si, however, is generally inapplicable to SiC device technology due to difficulties related to etching of SiC and removing the damage caused by the etching process (See, for example, U.S. Pat. No. 5,449,925 and [3]). The use of mesa termination in 4H—SiC diodes has also been disclosed (U.S. Pat. No. 6,897,133, [4], and [5]).

There still exists a need for semiconductor devices having improved properties.

SUMMARY

A semiconductor device is provided which comprises:
an n-type substrate;
a first layer of n-type semiconductor material on the n-type substrate, wherein the first layer of n-type semiconductor material is non-coextensive with the underlying n-type substrate thereby forming a mesa having an upper surface and sidewalls;
a plurality of raised n-type regions on the upper surface of the mesa, the raised n-type regions comprising an upper layer of n-type semiconductor material on a lower layer of n-type semiconductor material which is on the upper surface of the mesa, the raised n-type regions have an upper surface comprising the upper layer of n-type semiconductor material and sidewalls comprising an upper sidewall portion comprising the upper layer of n-type semiconductor material and a lower sidewall portion comprising the lower layer of n-type semiconductor material;
p-type regions between and adjacent the raised n-type regions and along the lower sidewall portion of the raised regions;
a first dielectric layer on the sidewalls of the raised regions, on the p-type layer between and adjacent the raised regions and on the sidewalls of the mesa;
one or more additional layers of dielectric material on the first dielectric layer on the sidewalls of the mesa and between and adjacent the raised regions on the upper surface of the mesa;
source ohmic contacts on the upper surfaces of the raised regions;
a gate ohmic contact on the implanted p-type layer;
a drain ohmic contact on the substrate layer opposite the first layer of semiconductor material;
one or more layers of metal on the source ohmic contacts;
one or more layers of metal on the gate ohmic contact; and
one or more layers of metal on the drain ohmic contact.

A method of making a semiconductor device is provided which comprises:
selectively etching through a first layer of n-type semiconductor material through openings in a mask to form raised regions and to expose an underlying second layer of n-type semiconductor material, wherein the second layer of n-type semiconductor material is on a third layer of n-type semiconductor material which is on an n-type substrate;
implanting p-type dopants into exposed surfaces of the second layer of n-type semiconductor material through openings in the mask to form implanted p-type regions;
removing the mask;
selectively etching through the third layer of n-type semiconductor material in a peripheral region of the device to expose underlying n-type substrate and to form a mesa having sidewalls and an upper surface, wherein the raised regions and the implanted p-type regions are on the upper surface of the mesa;
forming a first dielectric layer on the sidewalls of the mesa, on exposed surfaces of the substrate adjacent the mesa sidewalls, on the implanted p-type regions on the upper surface of the mesa and on the sidewalls and upper surfaces of the raised regions;
selectively etching the dielectric layer to expose the upper surfaces of the raised regions and at least a portion of the implanted p-type region on the upper surface of the mesa adjacent the raised regions;
forming source ohmic contacts on the exposed upper surfaces of the raised regions;

forming a gate ohmic contact on the exposed implanted p-type region on the upper surface of the mesa;

forming a drain ohmic contact on the n-type substrate opposite the third layer of n-type semiconductor material;

forming one or more additional dielectric layers between and adjacent the raised regions on the upper surface of the mesa, on the mesa sidewalls and on the substrate adjacent the mesa;

selectively etching through the one or more additional dielectric layers to expose the source ohmic contacts and the gate ohmic contact;

forming one or more metal layers on the source ohmic contacts;

forming one or more metal layers on the gate ohmic contact; and forming one or more metal layers on the drain ohmic contact.

REFERENCE NUMERALS

Figure 1:
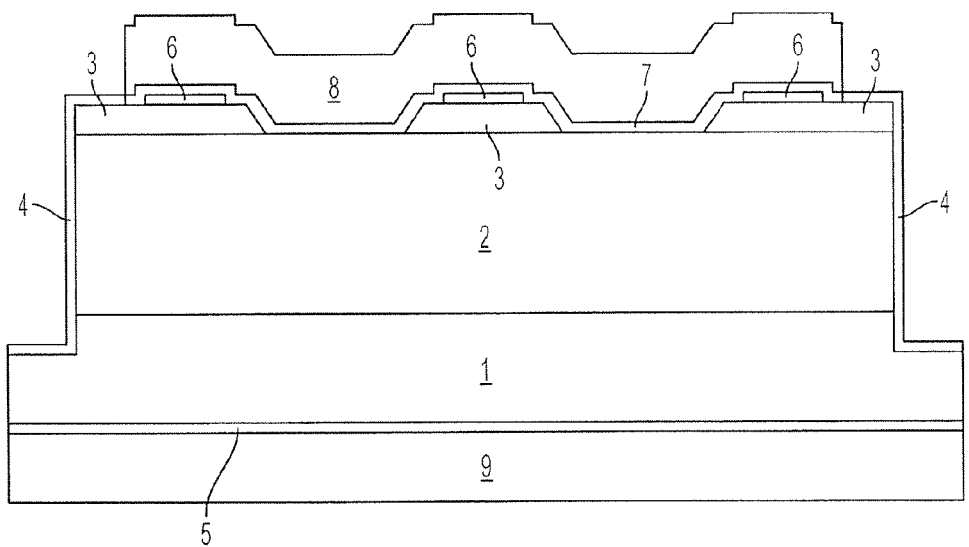
FIG. 1 is a schematic cross-section of a device according to one embodiment.

1 N-type SiC substrate (e.g., doping concentration of >1×10$^{18}$ cm$^{-3}$)

2 Epitaxially grown SiC layer (n-type). Representative thicknesses of this layer can be 0.75 µm-100 µm and representative doping concentrations can be 5×10$^{14}$-1×10$^{17}$ cm$^{-3}$.

3 Epitaxially grown SiC layer (p-type). Representative thicknesses of this layer can be 0.2-5 µm and representative doping concentrations can be >5×10$^{18}$ cm$^{-3}$.

4 Single or multilayer dielectric stack

5 Ohmic contact to n-type SiC material

6 Ohmic contact to p-type SiC material

7 Schottky contact

8 Front-side final metallization

9 Backside final metallization

The reference numerals used in FIGS. 9 and 10A-10I are defined in the following table. Also provided are exemplary and non-limiting layer thicknesses and doping concentrations for some of the layers or features of the device depicted in these Figures.

| | |
|---|---|
| 11 | N-type substrate (e.g., doping level > $1 \times 10^{18}$ cm$^{-3}$) |
| 12 | Epitaxially grown layer (n-type) (e.g., 1-350 µm thickness, $2 \times 10^{14}$-$1 \times 10^{17}$ cm$^{-3}$ doping conc.) |
| 13 | Epitaxially grown layer (n-type) (e.g., 0.5-5 µm thickness, $5 \times 10^{15}$-$5 \times 10^{17}$ cm$^{-3}$ doping conc.) |
| 14 | Epitaxially grown or implanted layer (n-type) (e.g., >0.1 µm thickness, >$1 \times 10^{18}$ cm$^{-3}$ doping conc.) |
| 15 | Implantation mask layer (e.g., PECVD oxide > 1.5 µm) |
| 16 | Selectively formed etch mask (e.g., Ni > 500 Å) |
| 17 | Implanted regions (p-type) (e.g., >0.1 µm thickness, >$1 \times 10^{18}$ cm$^{-3}$ doping conc.) |
| 18 | First dielectric layer (e.g., thermally-grown SiO$_2$, >500 Å thickness on vertical surfaces) |
| 18a | Additional dielectric layer or layers (e.g., single-layer or multi-layer) |
| 19a | Source ohmic contact |
| 19b | Gate ohmic contact |
| 19c | Drain ohmic contact |
| 20a | Source final metallization (e.g., single or multi-layer) |
| 20b | Gate final metallization (e.g., single or multi-layer) |
| 20c | Drain final metallization (e.g., single or multi-layer) |

DETAILED DESCRIPTION

According to one embodiment, the device comprises monolithically integrated Schottky barrier diodes and p-type/intrinsic/n-type (PiN) junction diodes connected in parallel fashion. An exemplary device is shown in FIG. 1. At normal operating conditions, the device acts as a Schottky barrier diode wherein the majority of the current flow occurs through the Schottky contacts. At surge current conditions, however, the current flows mainly through the p-n junctions because of significant reduction of drift resistance due to conductivity modulation at high current densities. This phenomenon can be illustrated by the following mathematical expression that computes the specific resistance of the base region of a PiN diode with forward current density $J_F$ [6]:

$$R(J_F) = \frac{t}{q \cdot \mu_n \cdot N + \frac{(\mu_n + \mu_p) \cdot J_F \cdot \tau_a}{t}} \quad (1)$$

In this formula, $\mu_n$ and $\mu_p$ are electron and hole mobilities respectively, $\tau_\alpha$ is ambipolar lifetime, and t and N represent the thickness and the doping concentration respectively of the drift (base) region. The optimal values of t and N can be chosen for the normal operation conditions (i.e., no conductivity modulation) as a function of targeted blocking voltage $V_B$ and maximum plane-junction electric field $E_{IDMAX}$ using the following formulas [7]:

$$t_{opt}(V_b, E_{1DMAX}) = \frac{3}{2} \cdot \frac{V_b}{E_{1DMAX}} \quad (2)$$

$$N_{opt}(V_b, E_{1DMAX}) = \frac{4}{9} \cdot \frac{\varepsilon_0 \cdot \varepsilon_r}{q} \cdot \frac{E_{1DMAX}^2}{V_b}$$

Figure 2:
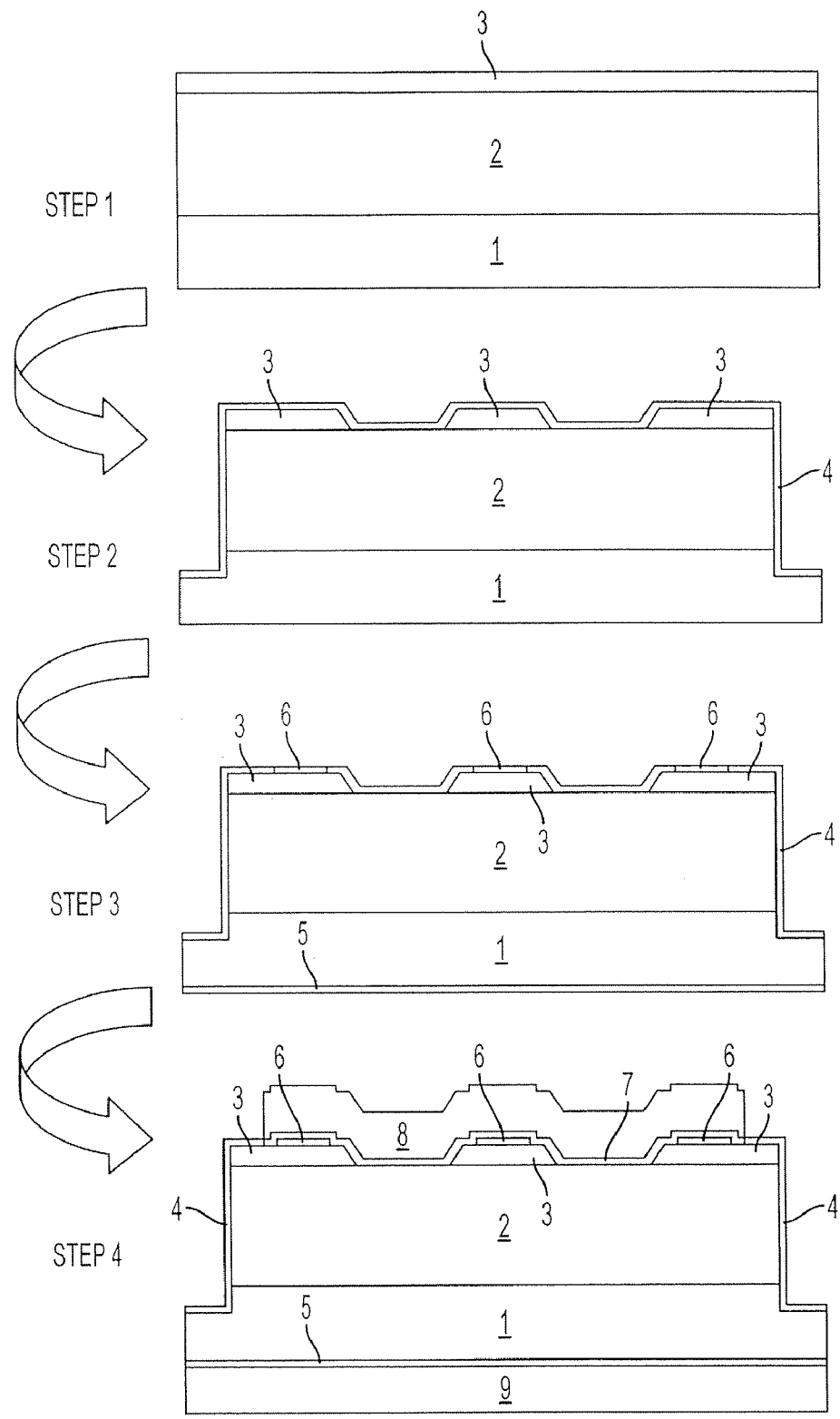
FIG. 2 is a schematic process flow for the fabrication of the device of FIG. 1.

An exemplary fabrication process of the described device may consist of the following macro-steps as shown in FIG. 2:
1. Growth of epitaxial stack
2. Selective plasma etches through p-type layer (3) down to n-type layer (2) to form p-type islands, and through p-type layer (3) and n-type layer (2) down to n-type substrate (1) layer to form device mesa, followed by thermal oxidation and optional deposition of additional dielectric layers to form dielectric stack (4). Thermal oxidation step consumes surface damage caused by plasma etch of SiC.
3. Formation of ohmic contact (5) on backside of n-type substrate (1) resulting in ohmic contact to n-type material followed by selective formation of ohmic contacts (6) on p-type islands resulting in ohmic contacts to p-type material.
4. Deposition of Schottky contact (7) and front-side final metal (8) resulting in metal stack (7-8) followed by deposition of backside final metal (9) resulting in backside metallization.

Metallization steps 3 and 4 include selective etching (e.g., wet etching) through the dielectric stack (4) in order to expose SiC surface prior to metal deposition and remove surface damage caused by plasma etching of SiC.

Figure 3:
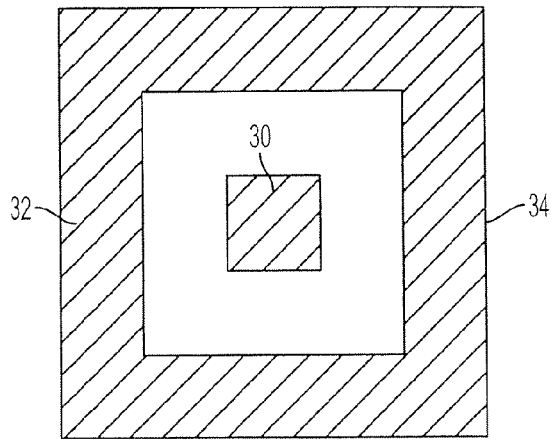
FIG. 3 shows an exemplary layout of p-type regions on the device mesa.

FIG. 3 shows an exemplary layout of a heavily doped p-type region (30) in a device according to one embodiment. Although a single square shaped region is shown in FIG. 3, the shape, number, and area of the p-type regions may vary. An outer p-type ring 32 is also shown as is the device mesa edge 34. The outer p-type ring 32 protects metal-semiconductor junctions from the highest electric field that occurs at the edge of the device. A metal-semiconductor junction exhibits significantly higher leakage current than that of a p-n junction for the same applied electric field due to thermionic field emission through the Schottky barrier [8].

As shown in FIG. 1, the described device employs mesa edge termination for protection from high electric field. Mesa etching through the main junction and voltage blocking layer is theoretically the most efficient method to eliminate electric field enhancement caused by two-dimensional effects. Assuming that there is no interface charge on the mesa sidewalls, the electric field distribution in the device can be calculated using the one-dimensional Poisson equation.

The method described above is relatively simple from the fabrication point of view because it does not need difficult-to-control and expensive fabrication steps such as high-temperature ion implantation and post-implant annealing required, for example, to form an aluminum-implanted junction termination extension (JTE) edge termination. Because the depletion region in mesa-terminated devices does not spread laterally under reverse bias, this method also allows for more efficient use of area than with other edge termination techniques, resulting in lower cost and higher yield.

Figure 4A:
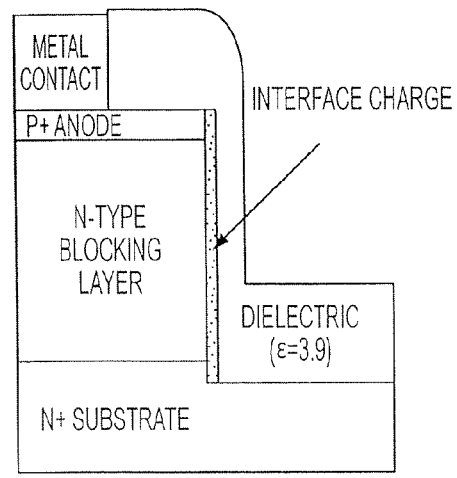
FIG. 4A is a schematic cross-section of a mesa-terminated 4H—SiC PiN diode.
Figure 4B:
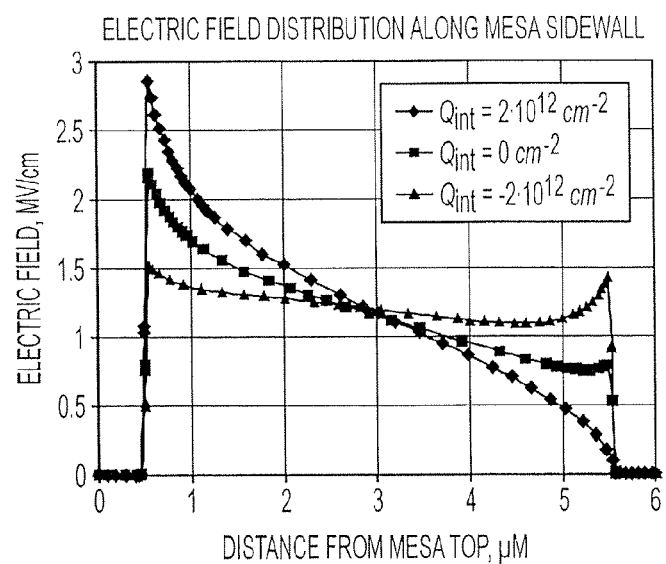
FIG. 4B is a graph showing electric field distribution along the mesa sidewall for different interface charge densities at a reverse bias of 600 V.

Despite the numerous advantages, mesa edge termination requires careful sidewall passivation in order to minimize the interface trap density and the amount of fixed charge stored at or near the mesa sidewalls. FIGS. 4A and 4B illustrate the influence of the interface charge on the field distribution along the sidewall of a mesa-terminated 4H—SiC PiN diode reverse biased to 600 V. In particular, FIG. 4A is a schematic cross-section of a mesa-terminated 4H—SiC PiN diode. FIG. 4B is a graph showing electric field distribution along the mesa sidewall for different interface charge densities at a reverse bias of 600 V. As shown in FIG. 4B, a certain amount of negative charge in the passivation layer can be beneficial, since it further reduces the maximum electric field along the mesa sidewalls. In practice, however, the fixed charge in the silicon dioxide used for passivation in SiC devices is usually positive and a negative charge introduced by interface traps and electrons injected into the passivation layer may cause memory effects and compromise high-temperature performance of the device.

To illustrate the almost one-dimensional nature of the field distribution along the mesa sidewalls, the surface electric field has been investigated as a function of applied reverse bias.

Figure 5:
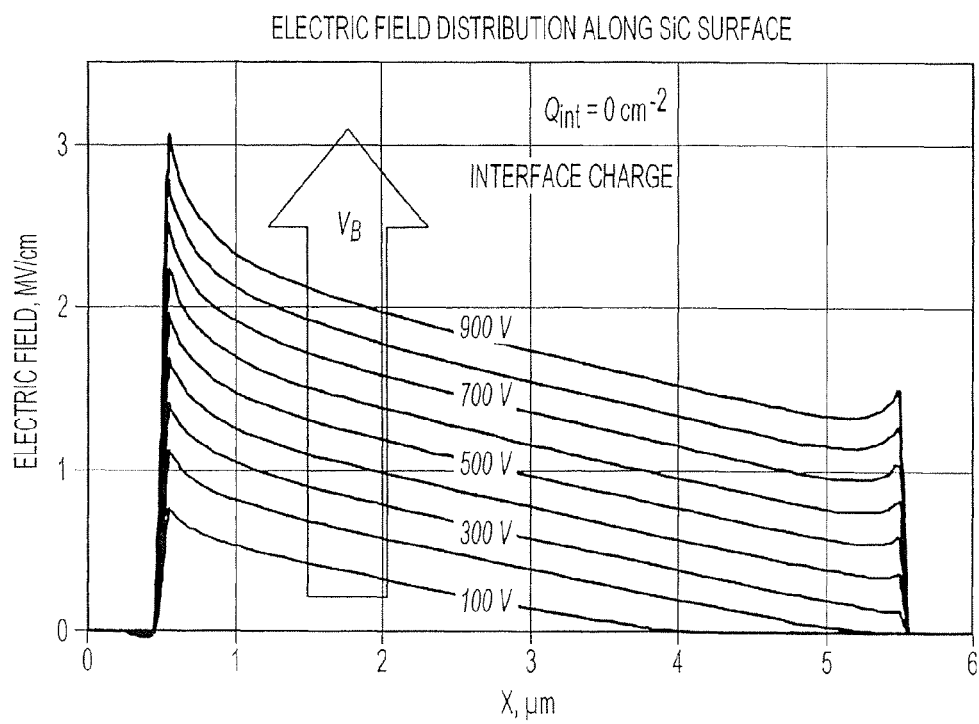
FIG. 5 is a graph showing the dynamics of electric field distribution along the mesa sidewall in 4H—SiC PiN diode assuming zero interface charge density.

FIG. 5 shows the family of mesa surface field distributions at reverse voltages from 100 V to 900 V when no surface charge is present. As shown in FIG. 5, the surface field experiences a linear increase with applied reverse bias, and the field distribution maintains adequate linearity along the mesa sidewall regardless of the applied bias.

EXPERIMENTAL

Figure 6:
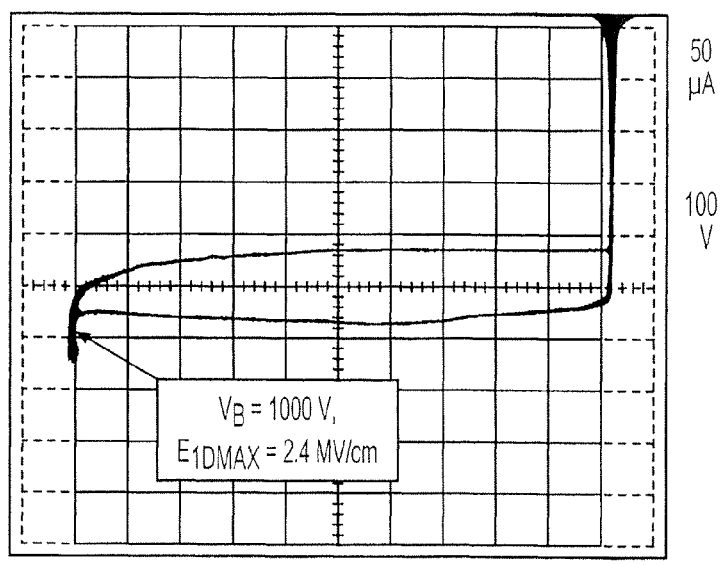
FIG. 6 illustrates non-destructive avalanche breakdown measured on a mesa-terminated diode with 5.7 µm, $1.25 \times 10^{16}$ cm$^{-3}$ base layer.
Figure 7A:
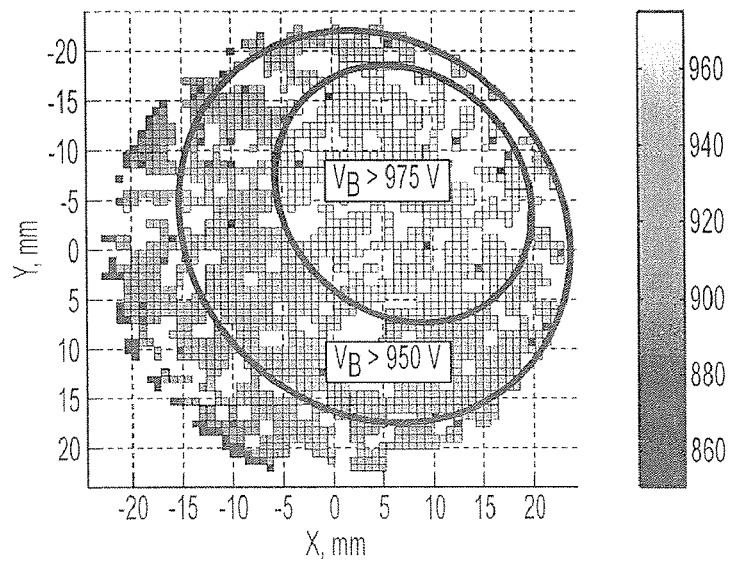
FIGS. 7A and 7B are wafer maps showing measured breakdown voltages (A) and extracted $E_{IDMAX}$ (B) on the same substrate. Reverse bias measurements were done with 25 V step. Devices with $V_B$<850 V are excluded from the maps.

4H—SiC PiN diodes were fabricated with a voltage blocking layer designed for the maximum plane-junction electric field $E_{1DMAX}$=1.8 Mv/cm at $V_B$=600 V and employing mesa etching for edge termination. After completing the fabrication, on-wafer I-V measurements were done in Fluorinert™ using Keithley 237 SMU and a Tektronix 576 curve tracer. The devices with both types of edge termination demonstrated a reversible avalanche breakdown. FIG. 6 shows a non-destructive avalanche breakdown measured on a mesa-terminated diode using a Tektronix 576 curve tracer. Wafer-scale measurements of the breakdown voltage were done with a 25 V step increment of reverse bias. A typical $V_B$ map is shown in FIG. 7A. The maximum 1-D electric field $E_{1DMAX}$ was then extracted from the measured epi parameters and breakdown voltage using expression $$E_{1DMAX} = \frac{V_B}{t} + \frac{q \cdot t \cdot N}{2 \cdot \varepsilon_0 \cdot \varepsilon_r} \quad (3)$$

Figure 7B:
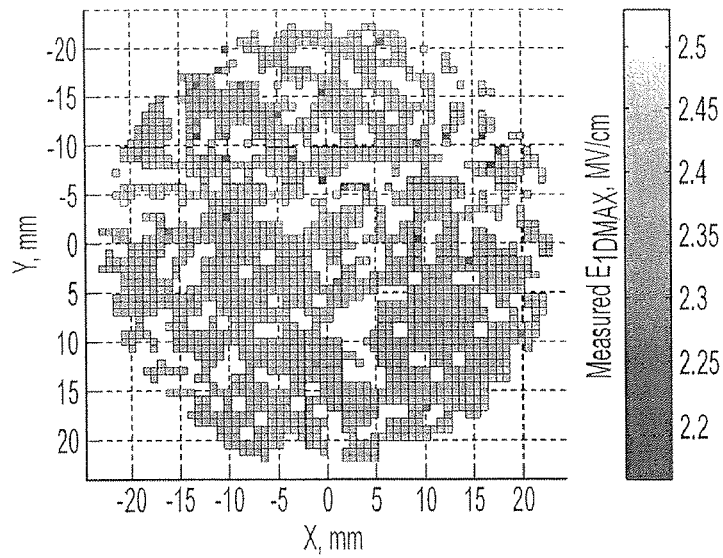

On mesa-terminated diodes, the mean value of this field was found to be of 2.4 MV/cm with a standard deviation σ=35 kV/cm. Such small standard deviation from the mean value corresponded to $E_{1DMAX}$ uniformity of 1.45%. A map of $E_{1DMAX}$ is shown in FIG. 7B. The experimentally achieved $E_{1DMAX}$ of 2.4 MV/cm corresponds to 93% of the "theoretical value" of critical electric field in 4H—SiC given by Reference [9]:

$$E_c = \frac{2.49 \times 10^6}{1 - \frac{1}{4}\log_{10}\left(\frac{N_D}{10^{16}\text{cm}^{-3}}\right)} V/\text{cm}. \quad (4)$$

Figure 8:
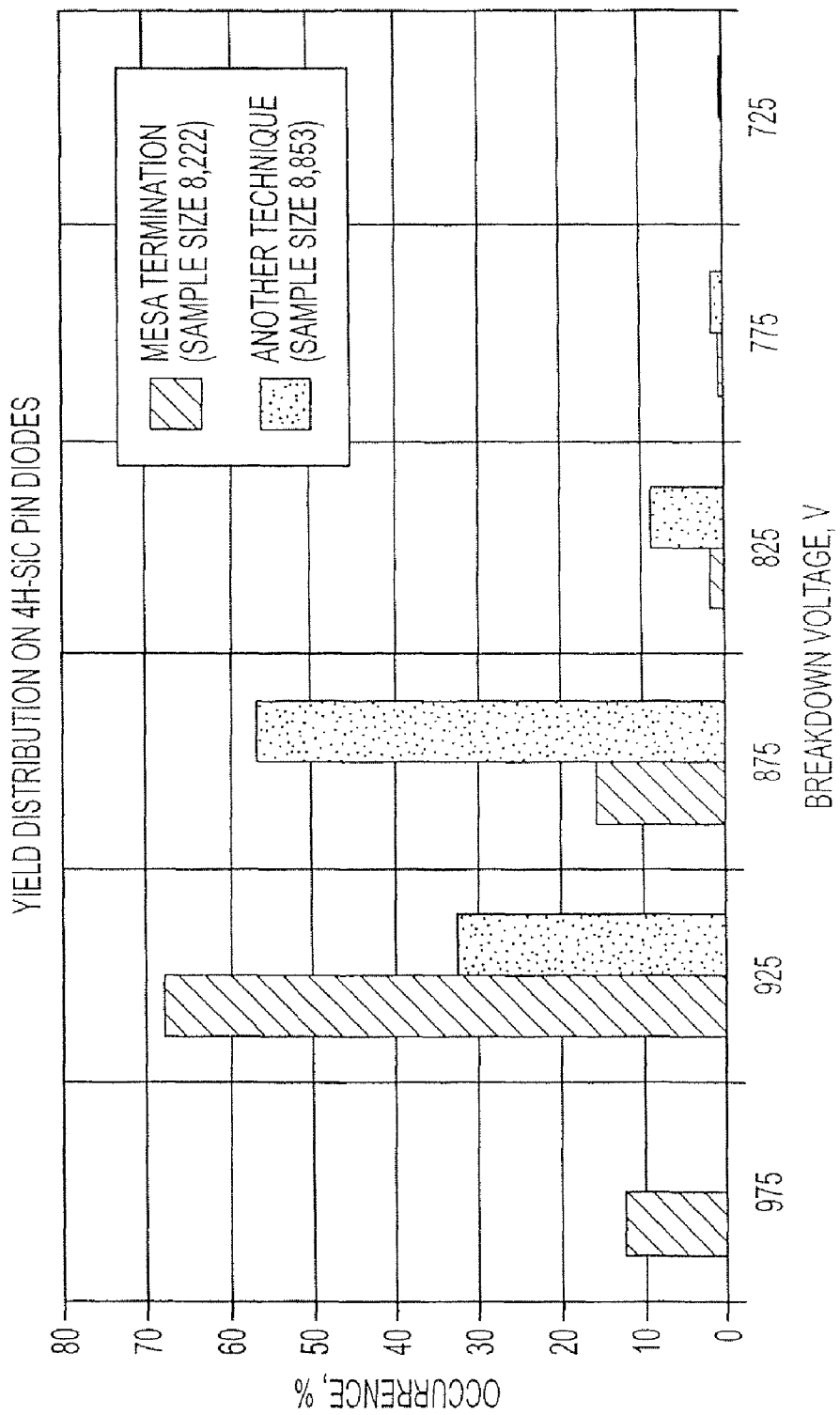
FIG. 8 is a graph showing a comparison of yield distribution between 4H—SiC PiN diodes with different edge termination techniques.

Although the charge conditions on the mesa sidewalls are unknown, the simulation results suggest that the electric field may experience a certain non-linear increase as shown in FIGS. 4 and 5. In this case, the electric field reaches its true critical value at the anode junction that triggers an avalanche breakdown. The majority of the mesa-terminated devices measured on all 3 substrates (5584 of 8222 tested, or 67.9%) demonstrated an average breakdown voltage ranging from 925 V to 975 V. FIG. 8 shows a comparison between yield distributions of the diodes fabricated using mesa edge termination and a different edge termination technique.

Although devices having a single layer of n-type SiC semiconductor material are described above, the device may comprise multiple layer of n-type SiC semiconductor material. For example, the device may comprise a first layer of n-type SiC semiconductor material in contact with the SiC substrate layer and a second layer of n-type SiC semiconductor material on the first layer of n-type SiC semiconductor material. The second layer of n-type SiC semiconductor material may have a lower doping concentration than the first layer of n-type SiC semiconductor material.

Figure 9:
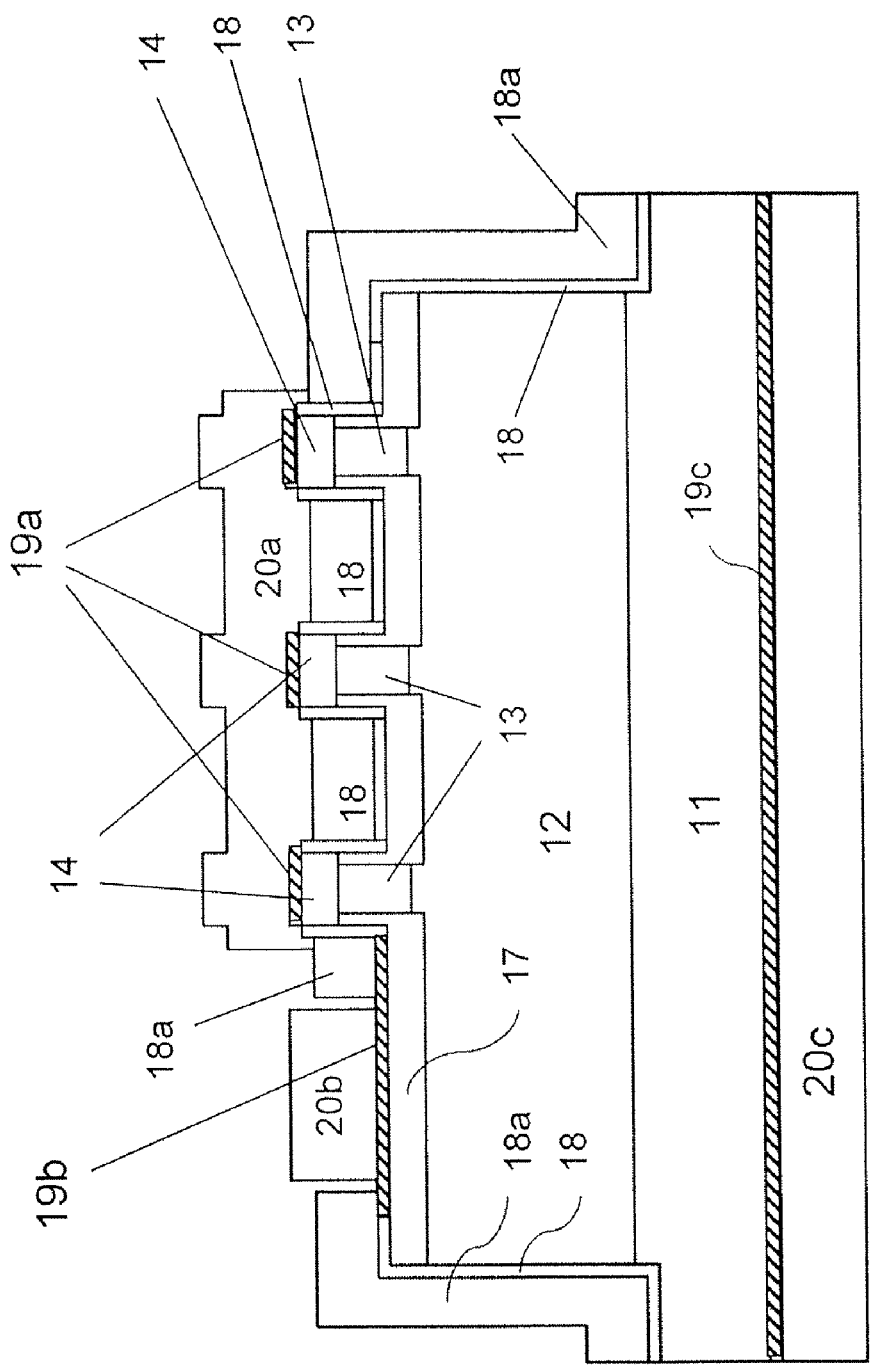
FIG. 9 is a schematic illustrating a vertical junction field effect transistor (VJFET) with a mesa termination

A vertical junction field effect transistor (VJFET) having a mesa termination is also provided. A device of this type is depicted in FIG. 9. As shown in FIG. 9, this device comprises an n-type substrate (11) and a first layer of n-type semiconductor material (12) on the substrate. The first layer of n-type semiconductor material is non-coextensive with the underlying n-type substrate (11) thereby forming a mesa having an upper surface and sidewalls. As shown in FIG. 9, the device also comprises a plurality of raised n-type regions on the upper surface of the mesa. Each of the raised n-type regions comprises an upper layer of n-type semiconductor material (14) on a lower layer of n-type semiconductor material (13) which is on the upper surface of the mesa. Each of the raised n-type regions also comprises an upper surface and upper sidewall portions comprising the upper layer of n-type semiconductor material (14) and lower sidewall portions comprising the lower layer of n-type semiconductor material (13). The device also comprises p-type regions (17) between and adjacent the raised n-type regions and along the lower sidewall portions of the raised regions. As depicted in FIG. 9, the device also comprises a first dielectric (e.g., $SiO_2$) layer (18) on the sidewalls of the raised regions, on the p-type layer between and adjacent the raised regions and on the sidewalls of the mesa. As also depicted in FIG. 9, the device comprises one or more additional layers of dielectric material (18a) on the first dielectric layer (18) on the sidewalls of the mesa and between and adjacent the raised regions on the upper surface of the mesa. Source ohmic contacts (19a) are formed on the upper surfaces of the raised regions, a gate ohmic contact (19b) is formed on the implanted p-type regions (17) and a drain ohmic contact (19c) is formed on the substrate layer (11) opposite the first layer of semiconductor material (12). Source metal layer (20a) is formed on the source ohmic contacts, gate metal layer (20b) is formed on the gate ohmic contact (19b) and drain metal layer (20c) is formed on the drain ohmic contact (19c).

Figure 10A:
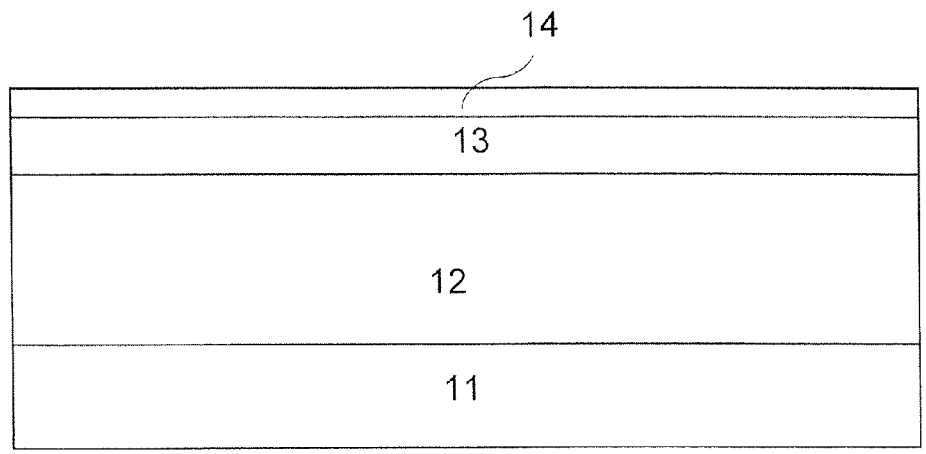
FIGS. 10A-10I are schematics illustrating a method of making a vertical junction field effect transistor (VJFET) with a mesa termination as shown in FIG. 9.

The device of FIG. 9 can be made by a method as set forth in FIGS. 10A-10I. As shown in FIG. 10A, a first layer of n-type semiconductor material (14) is on a second layer of n-type semiconductor material (13) which is on a third layer of n-type semiconductor material (12) which is on an n-type substrate (11). The second and third layers of n-type semiconductor material can be formed by epitaxial growth. The first layer can be formed by epitaxial growth on the second layer or by implanting n-type dopants in the second layer. The first layer of n-type semiconductor material can have a thickness of greater than 0.1 μm and/or a doping concentration of greater than $1\times10^{18}$ $cm^3$. The second layer of n-type semiconductor material can have a thickness of 0.5 to 5 μm and/or a doping concentration of $5\times10^{15}$ to $5\times10^{17}$ $cm^{-3}$. The third layer of n-type semiconductor material can have a thickness of 1 to 350 μm and/or a doping concentration of $2\times10^{14}$ to $1\times10^{17}$ $cm^{-3}$.

Figure 10B:
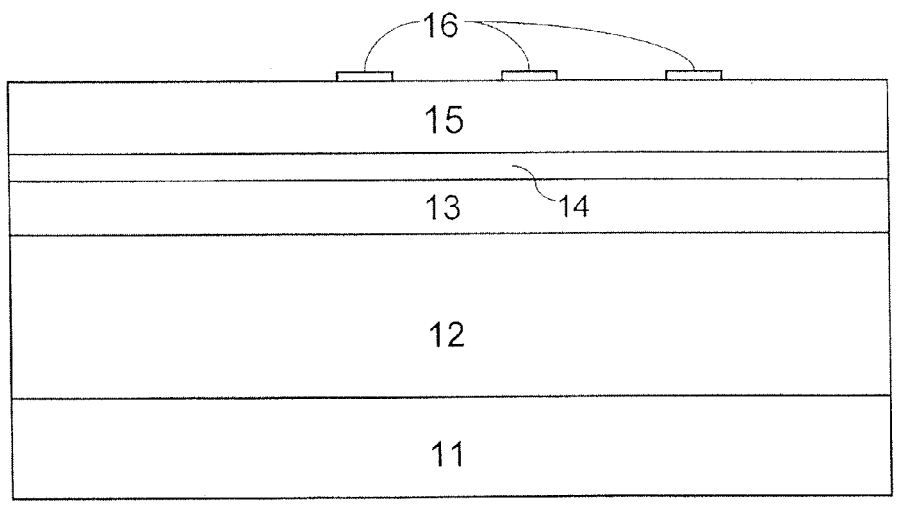

As shown in FIG. 10B, an implantation mask layer (15) can be formed on the upper surface of a first layer of n-type semiconductor material (14). The implantation mask layer (15) can be an $SiO_2$ layer formed by, for example, plasma enhanced chemical vapor deposition (PECVD). As also shown in FIG. 10B, an etch mask (16) can be selectively formed on the implantation mask layer (15). Etch mask (16) can comprise nickel (Ni) and can have a thickness greater than 500 Angstroms.

Figure 10C:
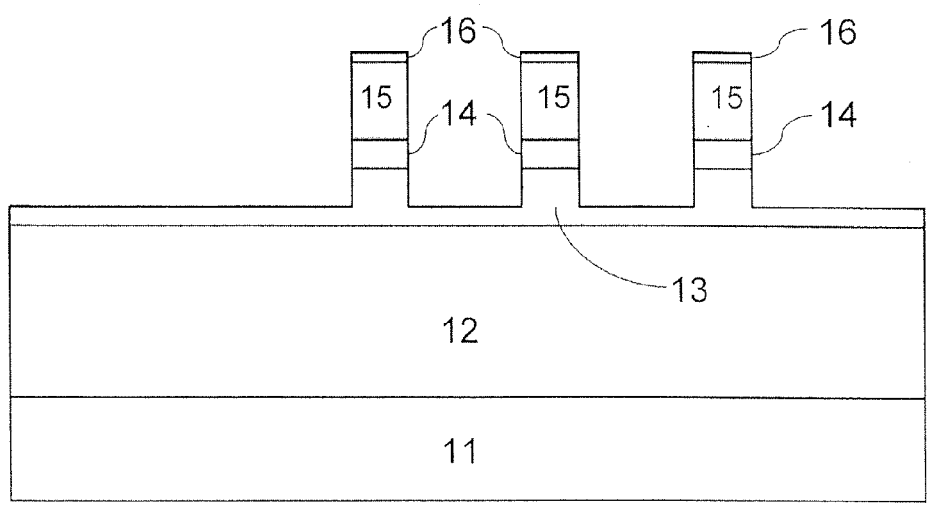

As shown in FIG. 10C, the implantation mask layer (15) and the first layer of n-type semiconductor material (14) can be selectively etched through openings in the etch mask (16) to form corresponding openings in the underlying implantation mask layer (15) and to form the raised regions thereby exposing the underlying second layer of n-type semiconductor material. As also shown in FIG. 10C, the second layer of n-type semiconductor material (13) can be partially etched into during selective etching of the implantation mask layer (15) and the first layer of n-type semiconductor material (14).

Figure 10D:
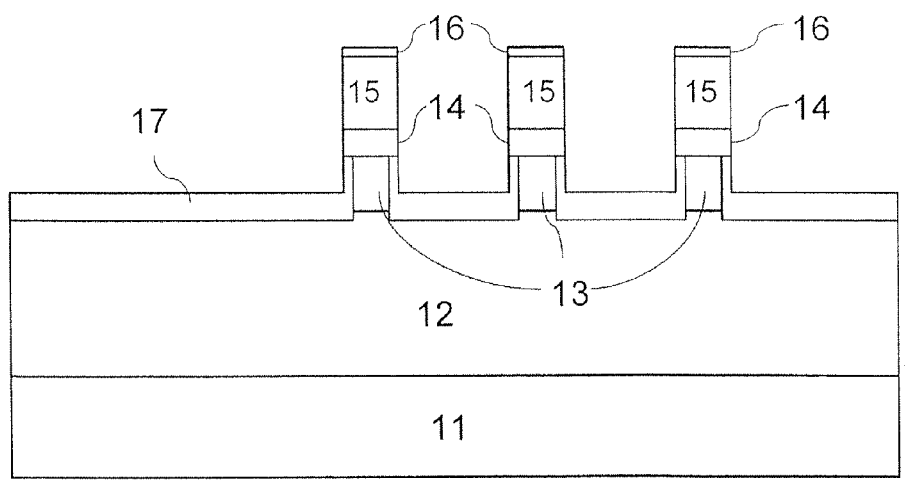

As shown in FIG. 10D, p-type dopants can then be implanted into the exposed surfaces of the second layer of n-type semiconductor material (13) through openings in the implantation mask layer (15) to form p-type regions (17). The p-type regions (17) can have a thickness of greater than 0.1 μm and/or a doping concentration of greater than $1\times10^{18}$ $cm^{-3}$.

Figure 10E:
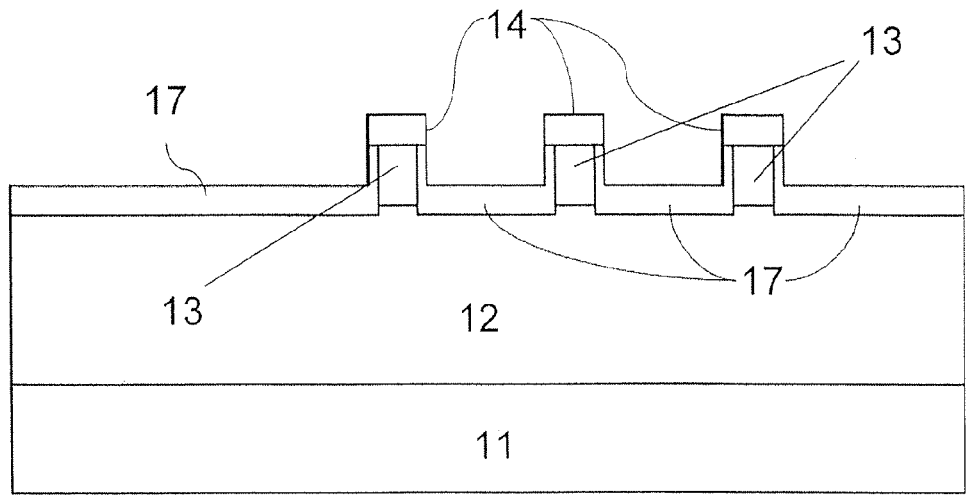

As shown in FIG. 10E, etch mask (16) and implantation mask (15) can then be removed.

Figure 10F:
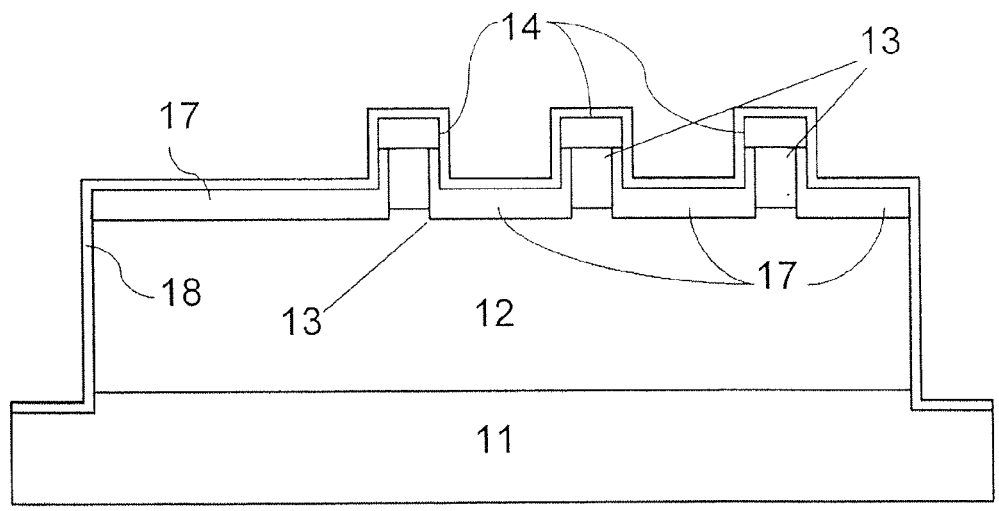

As shown in FIG. 10F, third layer of n-type semiconductor material (12) can then be selectively etched to expose underlying n-type substrate (11) in a peripheral region of the device to form the mesa. As also shown in FIG. 10F, a dielectric layer (18) can be formed on the sidewalls of the mesa, on exposed surfaces of the substrate, on the implanted p-type regions on the upper surface of the mesa and on the sidewalls and upper surfaces of the raised regions. Dielectric layer (18) can be thermally grown $SiO_2$. Dielectric layer (18) can have a thickness of greater than 500 Angstroms on the sidewalls of the mesa and on the sidewalls of the raised regions.

Figure 10G:
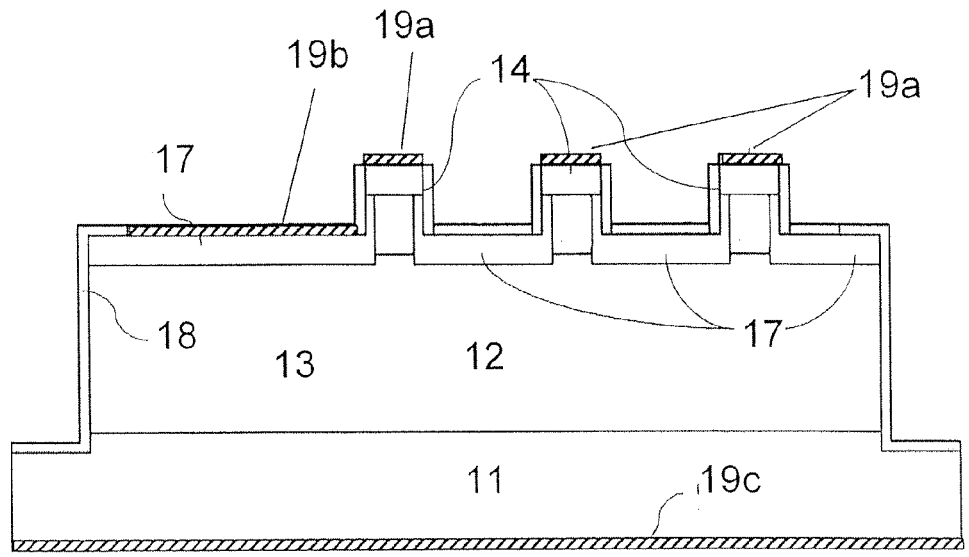

Dielectric layer (18) can then be selectively etched to expose the upper surfaces of the raised regions and a portion of the implanted p-type region on the upper surface of the mesa adjacent the raised regions. As shown in FIG. 10G, source ohmic contacts (19a) can then be formed on the exposed upper surfaces of the raised regions. As also shown in FIG. 10G, a gate ohmic contact (19b) can be formed on the exposed implanted p-type region on the upper surface of the mesa and a drain ohmic contact (19c) can be formed on the n-type substrate opposite the third layer of n-type semiconductor material.

Figure 10H:
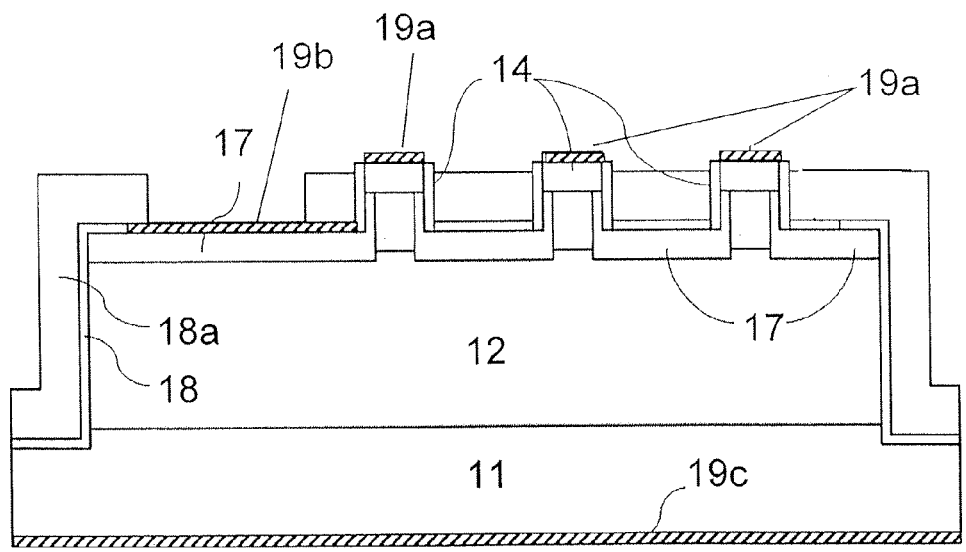
Figure 10I:
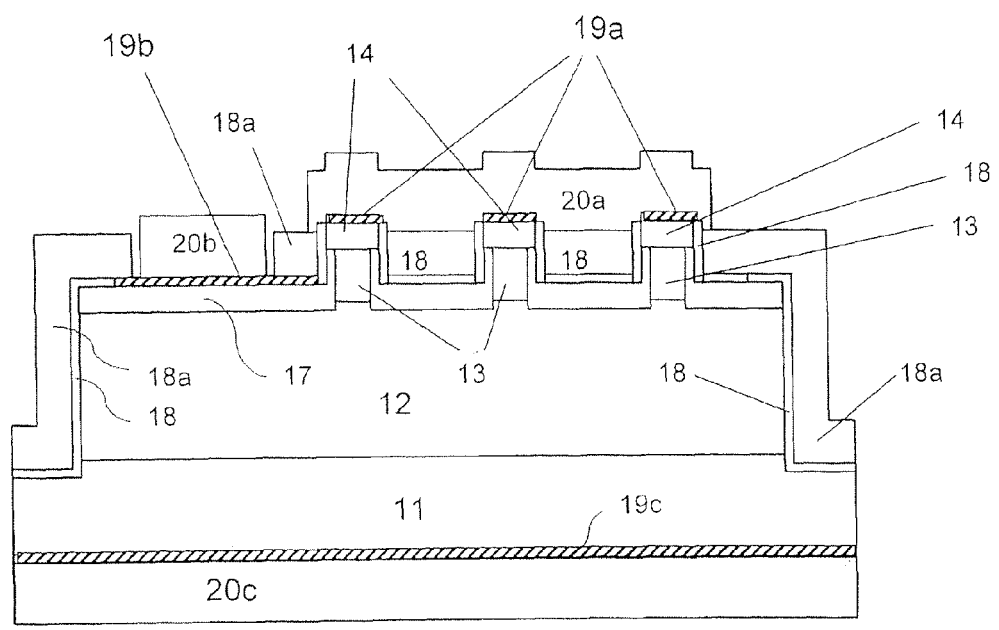

As shown in FIG. 10H, a dielectric layer (18a) can then be formed between and adjacent the raised regions on the upper surface of the mesa, on the mesa sidewalls and on the substrate adjacent the mesa. Although a single additional dielectric layer (18a) is depicted in FIG. 10H, multiple additional dielectric layers can be used. As also shown in FIG. 10H, source metal layer (20a), gate metal layer (20b) and drain metal layer (20c) can then be formed on the source ohmic contacts (19a), gate ohmic contact (19b) and drain ohmic contact (19c), respectively, to form the device as shown in FIG. 10I. Although a single metal layer is depicted in FIG. 10H for the source gate and drain metal, multiple metal layers can also be used.

Figures 11A, 11B:
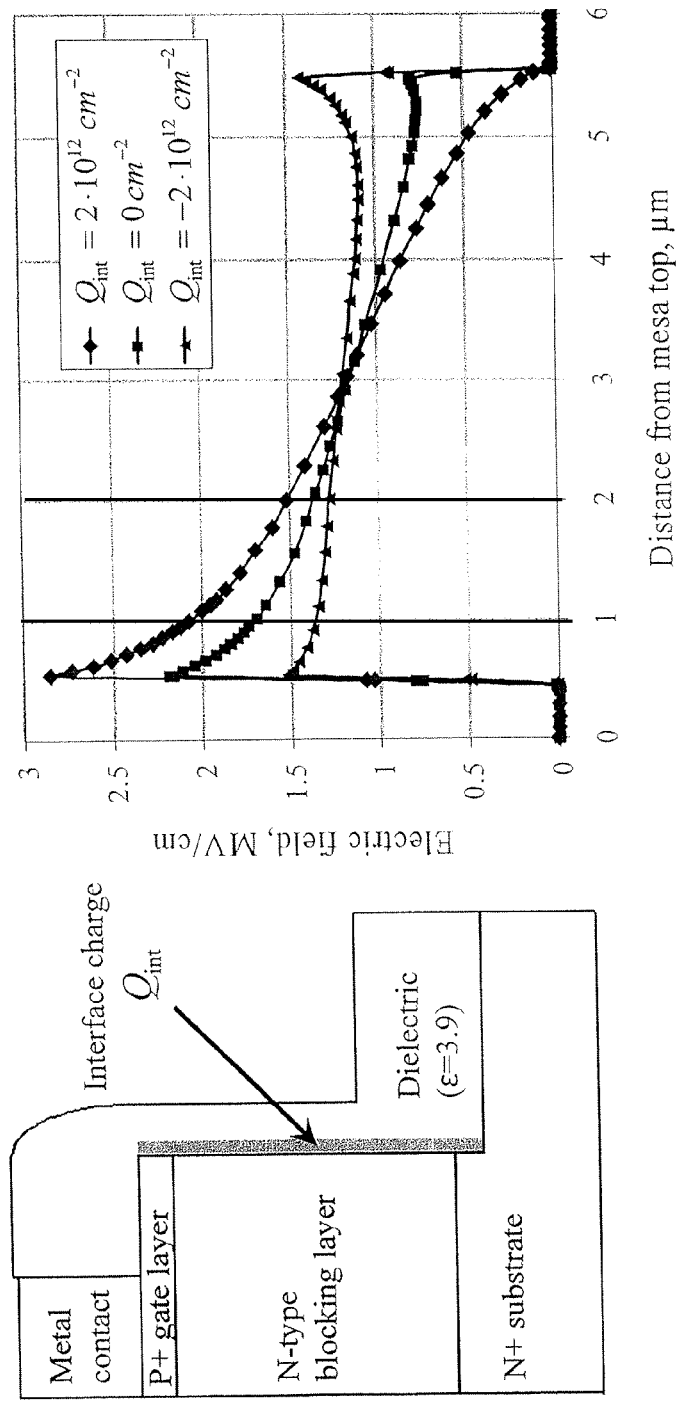
FIG. 11A is a schematic cross-section of the mesa termination region of a VJFET showing the interface charge region.
FIG. 11B is a graph showing the electric field distribution along the mesa sidewall for the VJFET shown in FIG. 11A.

FIGS. 11A and 11B illustrate the electric field along the mesa sidewall of a VJFET device as set forth in FIG. 9. FIG. 11A shows a portion of the device near the mesa sidewall indicating the interface charge ($Q_{int}$). As shown, the dielectric material on the sidewall of the mesa has a dielectric constant (∈) of 3.9 which is representative of the dielectric constant for SiO$_2$. FIG. 11B is a graph of the electric field (MV/cm) along the mesa sidewall as a function of the distance from the top edge of the mesa (in μm) for three different interface charge values (i.e., 2×10$^{12}$ cm$^{-2}$, 0 cm$^{-2}$ and −2×10$^{12}$ cm$^{-2}$). As can be seen from FIG. 10B, a negative charge in the passivation layer can reduce the maximum electric field along the mesa sidewall.

An exemplary material for forming ohmic contacts is nickel. Other ohmic contact materials for SiC, however, can also be used.

Suitable n-type dopants for SiC include nitrogen and phosphorous. Nitrogen is a preferred n-type dopant. Suitable p-type dopants for silicon carbide include boron and aluminum. Aluminum is a preferred p-type dopant. The above materials are merely exemplary, however, and any n or p-type dopant for silicon carbide can be used.

Although specific doping levels and thicknesses of the various layers of the device are described above, the doping levels and thicknesses of the various layers can be varied to produce a device having desired characteristics for a particular application.

Doping of the SiC layers can be performed in-situ during epitaxial growth of each of the layers on a SiC substrate. The SiC layers can be formed by any epitaxial growth method known in the art, including CVD, molecular beam and sublimation epitaxy. The doped SiC layers can be formed by doping in-situ during epitaxial growth wherein dopant atoms are incorporated into the silicon carbide during growth.

While the foregoing specification teaches the principles of the present invention, with examples provided for the purpose of illustration, it will be appreciated by one skilled in the art from reading this disclosure that various changes in form and detail can be made without departing from the true scope of the invention.

CITED REFERENCES

[1] B. J. Baliga, "Analysis of a high-voltage merged p-i-n/Schottky (MPS) rectifier," *IEEE Electron Device Letters*, Vol. 8, Issue 9, Sep. 1987 pp.: 407-409

[2] W. V. Muench and I. Plaffeneder: "Breakdown field in vapor-grown silicon carbide p-n junctions," *Journal of Applied Physics*, Vol. 48, No. 11, Nov. 1977

[3] V. E. Chelnokov, A. M. Strel'chuk, P. A. Ivanov; G. Lentz, C. Parniere: "Silicon carbide p-n structures as power rectifiers," *Proceedings of the 6th International Symposium on Power Semiconductor Devices and ICs*, 1994. ISPSD '94, pp.: 253-256

[4] K. V. Vasilevskii, K. Zekentes, A. V. Zorenko, and L. P. Romanov: "Experimental Determination of Electron Drift Velocity in 4H—SiC p+-n-n+ Avalanche Diodes," *IEEE Electron Device Letters*, Vol. 21, No. 10, Oct. 2000 pp.: 485-487

[5] L. Yuan, J. A. Cooper, Jr., M. R. Melloch, and K. J. Webb: "Experimental Demonstration of a Silicon Carbide IMPATT Oscillator," *IEEE Electron Device Letters*, Vol. 22, No. 6, Jun. 2001, pp.: 266-268

[6] D. T. Morisette and J. A. Cooper, Jr: "Theoretical Comparison of SiC PiN and Schottky Diodes Based on Power Dissipation Considerations," *IEEE Transactions on Electron Devices*, Vol. 49, No. 9, Sep. 2002, pp.: 1657-1664

[7] I. Sankin, J. B. Casady, "Power SiC MOSFETs," book chapter: *Advances in Silicon Carbide Processing and Applications*, S. E. Saddow and A. Agrawal, Editors

[8] H. Saitoh, T. Kimoto, and H. Matsunami: "Origin of Leakage current in SiC Schottky Barrier Diodes at High Temperature," Material Science Forum Vols. 457-460 (2004) pp. 997-1000

[9] A. O. Konstantinov, Q. Wahab, N. Nordell, U. Lindefelt: "Ionization rates and critical fields in 4H silicon carbide," *Appl. Phys. Lett.*, Vol. 71, No. 1, 7 Jul. 1997, pp.: 90-92

What is claimed is:

1. A semiconductor device comprising:
   an n-type substrate having a front surface and a back surface;
   a first layer of n-type semiconductor material on and in direct contact with the front surface of the n-type substrate, wherein the first layer of n-type semiconductor material is non-coextensive with the underlying n-type substrate thereby forming a mesa having an upper surface and sidewalls, wherein the upper surface and sidewalls of the mesa form an edge and wherein the front surface of the n-type substrate adjacent the edge is exposed;
   a plurality of raised n-type regions on the upper surface of the mesa, the raised n-type regions comprising an upper layer of n-type semiconductor material on a lower layer of n-type semiconductor material which is on the upper surface of the mesa, the raised n-type regions have an upper surface comprising the upper layer of n-type semiconductor material and sidewalls comprising an upper sidewall portion comprising the upper layer of n-type semiconductor material and a lower sidewall portion comprising the lower layer of n-type semiconductor material, wherein the lower layer of n-type semiconductor material has a different doping concentration than the first layer of n-type semiconductor material;
   p-type regions on the upper surface of the mesa between and adjacent the raised n-type regions and along the lower sidewall portion of the raised regions, wherein the p-type regions are adjacent the edge of the mesa;
   a first dielectric layer on the sidewalls of the raised regions, on the p-type layer between and adjacent the raised regions and on the sidewalls of the mesa;
   one or more additional layers of dielectric material on the first dielectric layer on the sidewalls of the mesa and between and adjacent the raised regions on the upper surface of the mesa;
   source ohmic contacts on the upper surfaces of the raised regions;
   a gate ohmic contact on the p-type regions;
   a drain ohmic contact on the back surface of the substrate layer opposite the first layer of semiconductor material;
   one or more layers of metal on the source ohmic contacts;
   one or more layers of metal on the gate ohmic contact; and
   one or more layers of metal on the drain ohmic contact.

2. The semiconductor device of claim 1, wherein the n-type substrate, the first layer of n-type semiconductor material, the upper layer of n-type semiconductor material, the lower layer of n-type semiconductor material and the p-type regions each comprise a wide-bandgap semiconductor material.

3. The semiconductor device of claim 1, wherein the n-type substrate, the first layer of n-type semiconductor material, the upper layer of n-type semiconductor material, the lower layer of n-type semiconductor material and the p-type regions each comprise SiC.

4. The semiconductor device of claim 1, wherein the n-type substrate has a doping concentration of greater than 1×10$^{18}$ cm$^{-3}$.

5. The semiconductor device of claim 1, wherein the first layer of n-type semiconductor material has a doping concentration of $2\times10^{14}$ to $1\times10^{17}$ cm$^{-3}$.

6. The semiconductor device of claim 1, wherein the first layer of n-type semiconductor material has a thickness of 1 to 350 µm.

7. The semiconductor device of claim 1, wherein the lower layer of n-type semiconductor material has a doping concentration of $5\times10^{15}$ to $5\times10^{17}$ cm$^{-3}$.

8. The semiconductor device of claim 1, wherein the lower layer of n-type semiconductor material has a thickness of 0.5 µm-5 µm.

9. The semiconductor device of claim 1, wherein the upper layer of n-type semiconductor material has a doping concentration of greater than $1\times10^{18}$ cm$^{-3}$.

10. The semiconductor device of claim 1, wherein the upper layer of n-type semiconductor material has a thickness of greater than 0.1 µm.

11. The semiconductor device of claim 1, wherein the p-type regions have a doping concentration of greater than $1\times10^{18}$ cm$^{-3}$.

12. The semiconductor device of claim 1, wherein the p-type regions have a thickness of greater than 0.1 µm.

13. The semiconductor device of claim 1, wherein the first dielectric layer is an SiO$_2$ layer having a thickness of greater than 500 Angstroms on the sidewalls of the mesa and on the sidewalls of the raised regions.

14. The semiconductor device of claim 1, wherein the device comprises more than one additional layer of dielectric material on the first dielectric layer.

15. The semiconductor device of claim 1, wherein the device comprises more than one layer of metal on each of the source, gate and drain ohmic contacts.

16. The semiconductor device of claim 1, wherein the first layer consists of the n-type semiconductor material.

17. The semiconductor device of claim 1, wherein the device comprises an n-type conductive path between the source ohmic contact and the drain ohmic contact when no voltage is applied to the gate.

18. The semiconductor device of claim 1, wherein the device is an n-channel vertical junction field effect transistor.

19. The semiconductor device of claim 1, wherein the first dielectric layer is on the front surface of the n-type substrate adjacent the sidewalls of the mesa.

20. The semiconductor device of claim 1, wherein the interface between the n-type material on the sidewalls of the mesa and the first dielectric layer on the sidewalls of the mesa has a charge density of 0 or a negative charge density.

* * * * *